(12) United States Patent
Lai et al.

(10) Patent No.: US 8,317,970 B2
(45) Date of Patent: Nov. 27, 2012

(54) CEILING ELECTRODE WITH PROCESS GAS DISPERSERS HOUSING PLURAL INDUCTIVE RF POWER APPLICATORS EXTENDING INTO THE PLASMA

(75) Inventors: Canfeng Lai, Fremont, CA (US); Lily L. Pang, Fremont, CA (US); Majeed A. Foad, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1212 days.

(21) Appl. No.: 12/132,133

(22) Filed: Jun. 3, 2008

(65) Prior Publication Data

US 2009/0294065 A1  Dec. 3, 2009

(51) Int. Cl.
*C23C 16/00* (2006.01)
*H01L 21/306* (2006.01)

(52) U.S. Cl. .......... 156/345.48; 118/723 I; 118/723 AN

(58) Field of Classification Search ............... 118/723 I, 118/723 IR, 723 AN; 156/345.48, 345.49; 315/111.51
See application file for complete search history.

(56) References Cited

U.S. PATENT DOCUMENTS

| | | | |
|---|---|---|---|
| 6,685,798 B1 * | 2/2004 | Holland et al. | 156/345.48 |
| 7,879,731 B2 * | 2/2011 | Collins et al. | 438/714 |
| 2002/0121345 A1 * | 9/2002 | Chen et al. | 156/345.48 |
| 2006/0191880 A1 * | 8/2006 | Kwon et al. | 219/121.57 |
| 2008/0050292 A1 * | 2/2008 | Godyak | 422/186.29 |

* cited by examiner

*Primary Examiner* — Luz L. Alejandro
(74) *Attorney, Agent, or Firm* — Robert M. Wallace

(57) ABSTRACT

A gas distribution plate is formed of a metallic body having a bottom surface with plural gas disperser orifices and an internal gas manifold feeding the orifices. Each one of an array of discrete RF power applicators held in the plate includes (a) an insulating cylindrical housing extending through the plate, a portion of the housing extending outside of the plate through the bottom surface, and (b) a conductive solenoidal coil contained within the housing, a portion of the coil lying within the portion of the housing that extends outside of the plate through the bottom surface.

9 Claims, 8 Drawing Sheets

CEILING ELECTRODE WITH PROCESS GAS DISPERSERS HOUSING PLURAL INDUCTIVE RF POWER APPLICATORS EXTENDING INTO THE PLASMA

BACKGROUND

In plasma processing of a workpiece such as a semiconductor wafer, mask, flat panel display or solar cell, an inductively coupled plasma source can provide a high density plasma. An inductively coupled plasma source typical includes an RF power generator furnishing power through an impedance match and an inductively coupled source power applicator such as a coiled conductor or coil antenna. Such a coil antenna typically overlies the chamber ceiling, giving rise to certain problems. One problem is that a coil antenna configured to uniformly cover the processing zone (e.g., the area of the workpiece or wafer) necessarily has a significant amount of undesirable capacitive coupled RF voltage to the plasma. Such a coil antenna has a large voltage drop across its terminals when a high level of RF source power is applied, increasing the risk of arcing, and sputtering underneath. Another problem is that the ceiling must be formed of an insulating material to permit inductive coupling of RF power from the coil antenna into the chamber interior. Restricting the ceiling to insulating materials prevents use of the ceiling as a grounded return electrode, so that the effective grounded electrode area is limited to the chamber side wall. Restricting the ceiling to insulating materials makes it impractical for the ceiling to be configured as a gas distribution showerhead, so that process gas must be injected from the side, limiting the uniformity of gas distribution over the wafer. Finally, the efficiency of an overhead coil antenna is limited because it is displaced above the ion generation region.

SUMMARY

A gas distribution plate is provided for use in a plasma reactor for processing a workpiece. The gas distribution plate is formed of a metallic body having a bottom surface with plural gas disperser orifices in the bottom surface. The plate has an internal gas manifold coupled to the plural gas disperser orifices. An array of discrete RF power applicators are held in the plate, each one of the RF power applicators including (a) an insulating cylindrical housing extending through the plate, a portion of the housing extending outside of the plate through the bottom surface, and (b) a conductive solenoidal coil contained within the housing, a portion of the coil lying within the portion of the housing that extends outside of the plate through the bottom surface.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
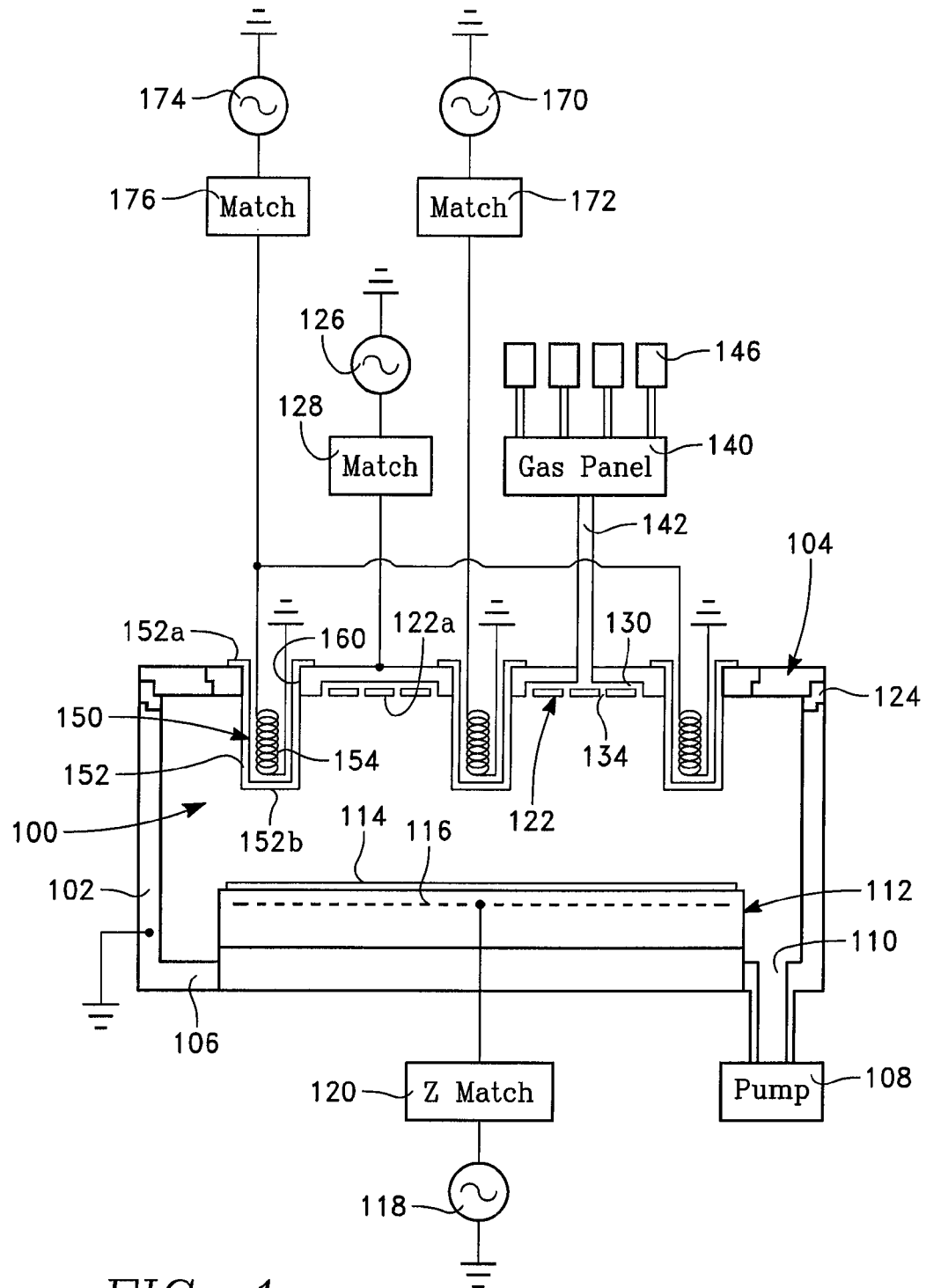
FIG. 1 is a side view of a reactor in accordance with a first embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

A conductive overhead gas distribution plate that is an electrode that can be grounded (or connected to a voltage source) includes an array of small discrete solenoidal coil antennas housed in discrete insulating cylindrical housings supported on and extending below the gas distribution plate into the plasma generation region. Each discrete solenoidal coil antenna, which is wound around a magnetically permeable core (ferrite core), has a diameter that is a fraction of the workpiece diameter and a cylindrical length contained within the discrete cylindrical housing. The axial length of each housing and the solenoidal coil contained within the housing may be sufficient so each housing and coil extends sufficiently below the gas distribution plate to be immersed in the plasma ion generation region. The discrete coil antennas may be arranged in radial inner and outer zones of the gas distribution plate, with RF source power applied to the different zones being controlled separately for plasma uniformity tuning.

The gas distribution plate may be grounded to the chamber side wall to enhance the ratio of grounded electrode area to the area of the cathode electrode underlying the workpiece. This enhances the voltage on the wafer. Division of the RF source power among the plural discrete coil antennas divides the voltage among the plural coil antennas, reducing the voltage drop along each one. The capacitive coupling of the array of coils is minimal because of efficient inductive coupling between coil and plasma thru the ferrite core. The reduced voltage on each coil reduces the sputtering and contamination. The combination of the conductive gas distribution plate with the array of downwardly extending solenoidal coils enables gas distribution from the ceiling while inductively coupling RF plasma source power from the ceiling and while employing the ceiling as an electrode. This results in uniform gas distribution with efficient coupling of RF source power to the plasma and enhanced electrode area.

Apportioning gas flow to inner and outer gas distribution zones in the gas distribution plate can enable radial distribution of the gas to be tuned. Apportioning RF power between inner and outer groups of the discrete coil antennas enables radial distribution of RF power to be tuned. These features enable the plasma distribution to be tuned for optimum uniformity, and provide a large plasma process window in pressure, gas composition, gas flow rate and other parameters in many plasma processes including chemical vapor deposition, seasoning layer deposition, plasma etching, plasma immersion ion implantation and chamber cleaning. The gas distribution plate can be plasma-cleaned without requiring a remote plasma source by employing the array of discrete downwardly extending solenoidal coil antennas as plasma source power applicators with a suitable cleaning gas. Typically, an inductively coupled source at the chamber ceiling requires an insulating ceiling. In the embodiments described herein, a conductive gas distribution plate is integrated with an inductively coupled plasma source at the ceiling. Grounding the gas distribution plate greatly increases the ratio of the grounded surface area of the chamber to the area of the bias electrode (the wafer support surface). This in turn increases the amount of bias voltage on the wafer for a given amount of applied RF power (e.g., RF bias power applied to the wafer). This increase represents a significant efficiency improvement.

Figure 2:
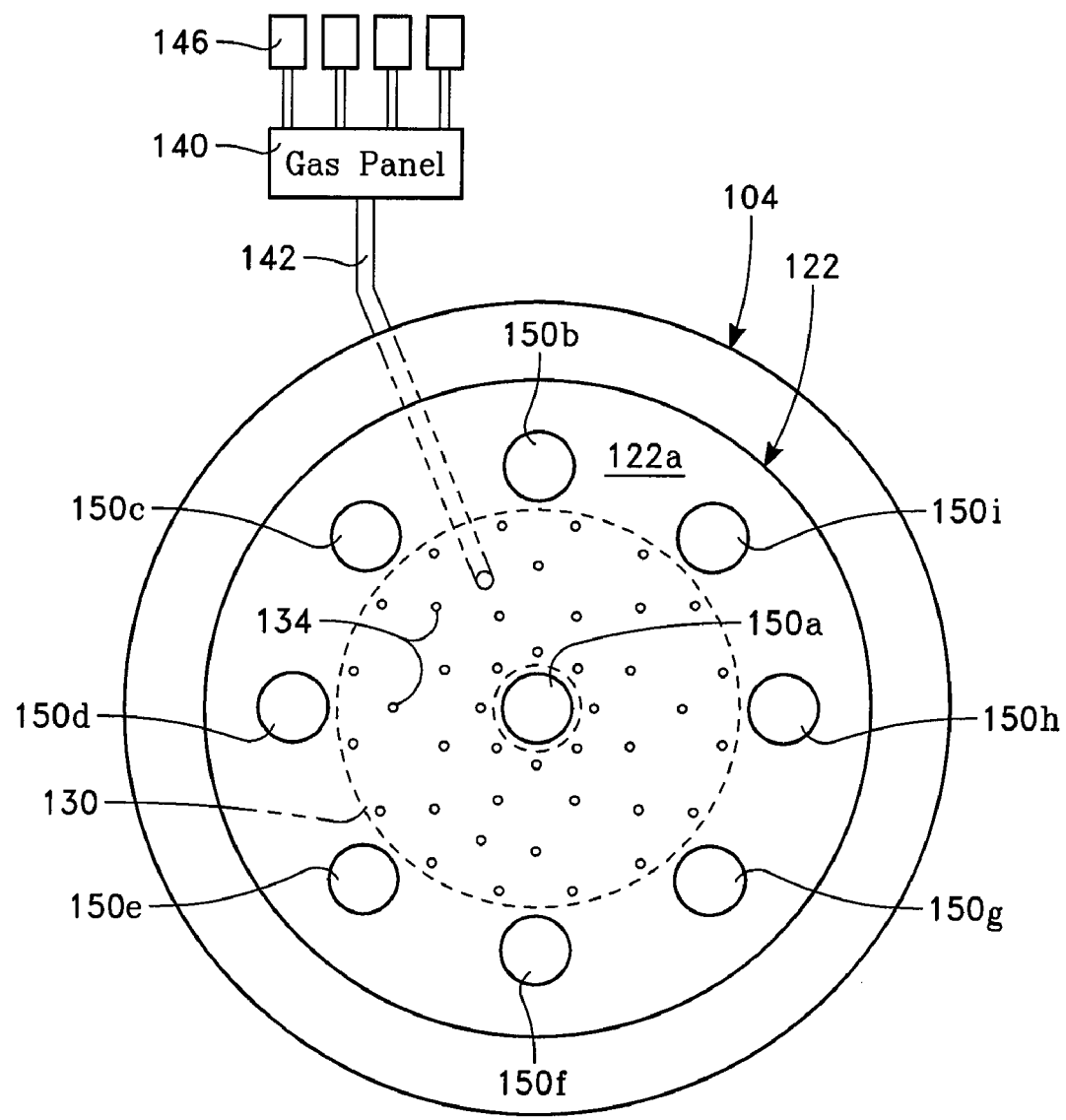
FIG. 2 is a bottom view of the ceiling of the reactor of FIG. 1.
Figure 3:
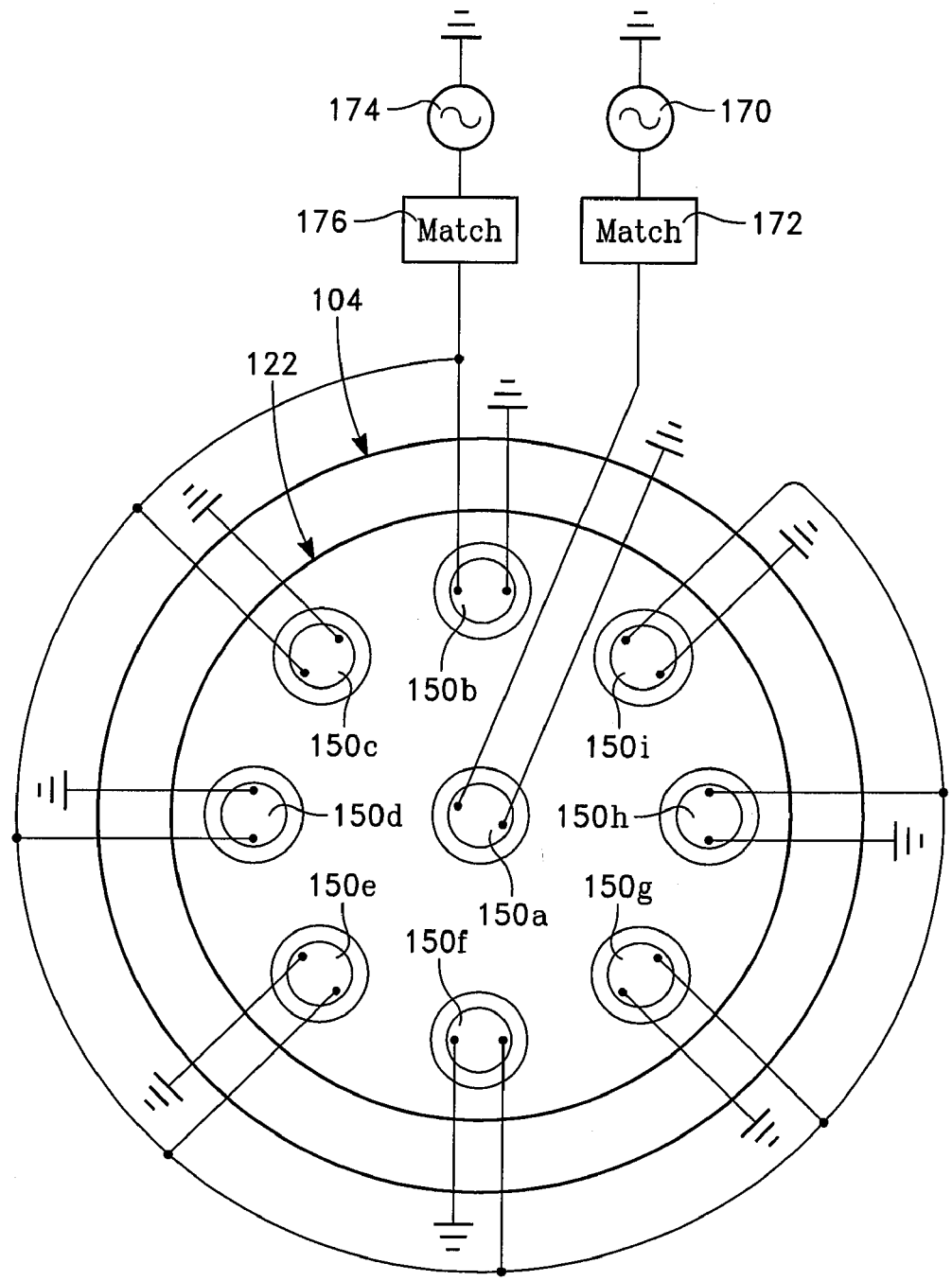
FIG. 3 is a top view of the reactor of FIG. 1.

Referring to FIGS. 1 through 3, a plasma reactor includes a vacuum chamber 100 enclosed by a cylindrical side wall 102, a disk-shaped ceiling 104 and a disk-shaped floor 106. The sidewall 102 and floor 106 may be metallic and connected to ground. A vacuum pump 108 evacuates the chamber 100 through a port 110 in the floor 106. A workpiece support pedestal 112 inside the chamber 100 can support a workpiece 114 such as a semiconductor wafer or mask for plasma processing. The pedestal 112 may include an internal electrode 116 coupled to a plasma RF bias power generator 118 through an RF impedance match 120.

The ceiling 104 includes a ceiling gas distribution plate (showerhead) 122 formed of metal. The plate 122 may be grounded through electrical contact with the grounded sidewall 102, for example. Alternatively, the plate 122 may instead by electrically isolated from the sidewall 102 by providing an optional insulator ring 124 between the plate 122 and the sidewall 102, permitting the electrical potential of the plate 122 to be governed independently. For example, the plate 122 may be driven by an optional RF power generator 126 through an RF impedance match 128. The gas distribution plate 122 includes an internal gas manifold 130. The bottom surface 122a of the gas distribution plate 122 has an array of gas dispersing orifices 134 aligned with the gas manifold 130. Process gas is supplied independently to the gas manifold 130 by a gas panel 140 through a gas supply conduit 142. Various process gas supplies 146 may be coupled to the gas panel 140, the gas panel controlling flow rates from each of the individual gas supplies 146 to the gas manifold 130.

Embedded in the gas distribution plate 122 is an array of individual cylindrical inductive power applicators 150 extending through the bottom surface 122a of the gas distribution plate 122 and into the interior of the chamber 100. Each individual cylindrical inductive power applicator 150 consists of a cylindrical non-conductive housing 152 having an upper portion 152a held by the gas distribution plate 122 and a lower portion 152b lying below the gas distribution plate bottom surface 122a and inside the chamber 100. Each housing 152 encloses a solenoidal conductive coil antenna 154 having a solenoidal axis that is transverse (e.g., perpendicular) to the plane of the gas distribution plate bottom surface 122a. In one embodiment, the axis of each of the coils 154 has its axis parallel to the axis of symmetry of the cylindrical sidewall 102. Each housing 152 is formed of an insulating material, such as a ceramic material, in order to permit inductive coupling of RF power from the coil antenna 154 into the interior of the chamber 100. The array of gas dispersing orifices 134 has voids coinciding with holes 160 in the gas distribution plate 122 into which the housings 152 are inserted. In one embodiment, the housings 152 may be press fit into the holes 160. The lower housing portion 152b may extend beyond the bottom surface 122a into the chamber interior by a distance that is a fraction of the distance between the bottom surface 122a and the workpiece 114. This fraction may be in a range between 1/20 and 1/5, for example, and may be sufficient to ensure that the corresponding (lower) portion of the coil 154 is effectively immersed in the plasma, although shielded from the plasma by the insulative housing 152.

Referring to FIGS. 2 and 3, the inductive power applicators 150 may be arrayed in an inner zone consisting (for example) of an single inductive power applicator 150a and an outer zone consisting of eight inductive power applicators 150b through 150i evenly arranged in a circle. The inner zone inductive power applicator 150a is driven by a first RF source power generator 170 through an RF impedance match 172, while the outer zone inductive power applicators 150b-150i are driven by a second RF source power generator 174 through an RF impedance match 176.

Figure 4:
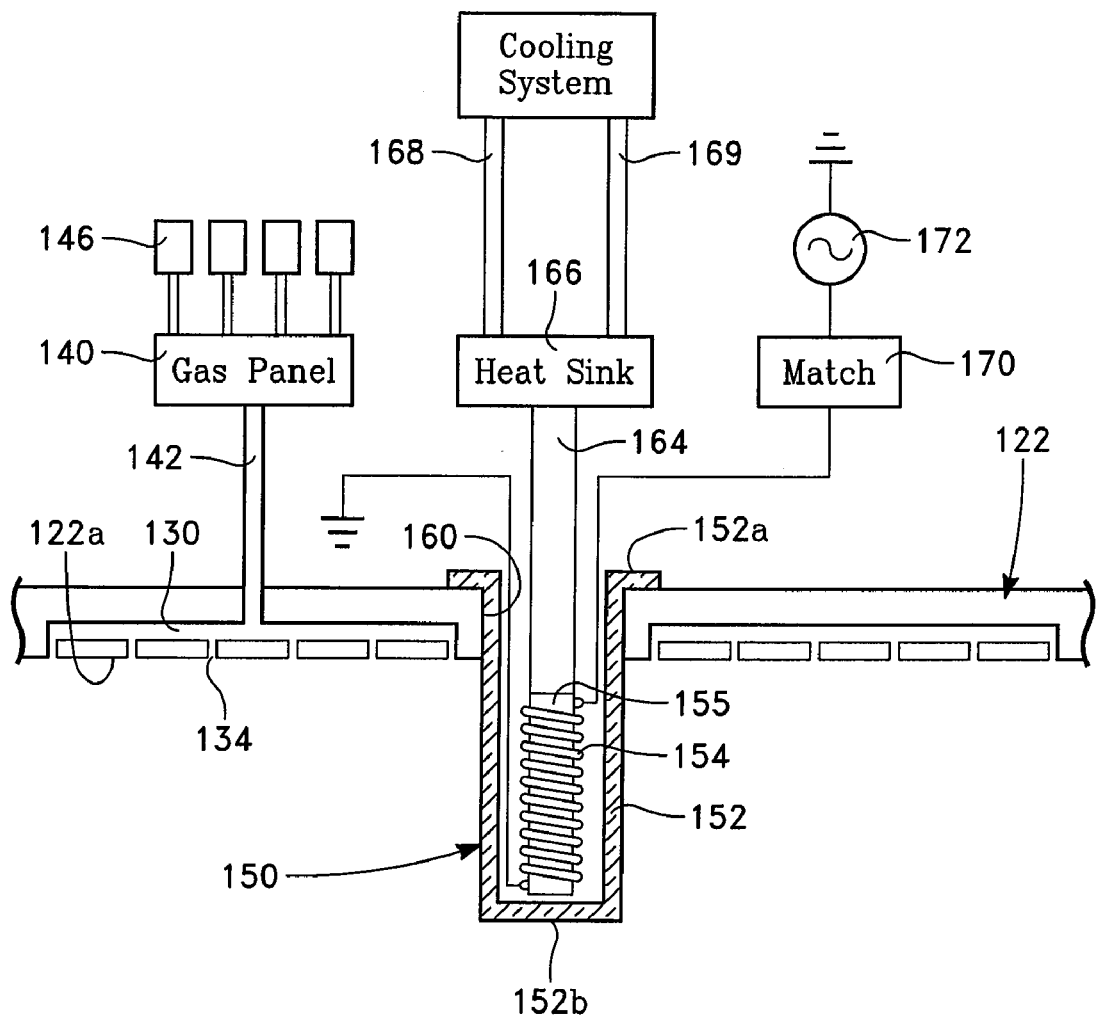
FIG. 4 is an enlarged side view of a portion of the ceiling of the reactor of FIG. 1.

Referring to FIG. 4, each inductive power applicator 150 may include an inductive or magnetically permeable (e.g., ferrite) cylindrical core 155 around which the coil 154 is wound. The core 155 may be coupled through a copper heat conductor 164 to a heat sink 166 having coolant supply and return ports 168, 169 coupled to internal coolant circulation passages (not illustrated) inside the heat sink 166.

Figure 5:
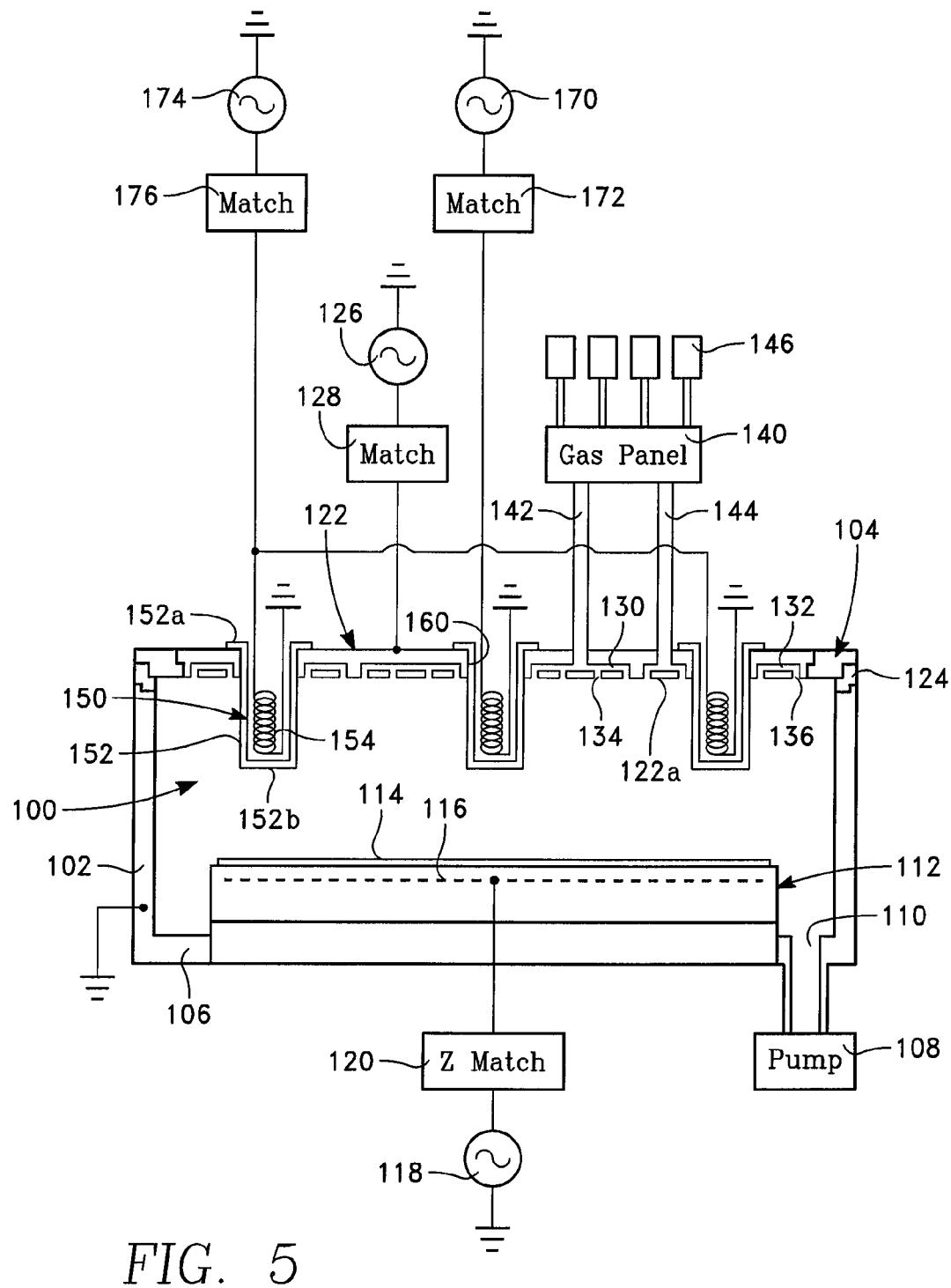
FIG. 5 is a side view of a reactor in accordance with a second embodiment.
Figure 6:
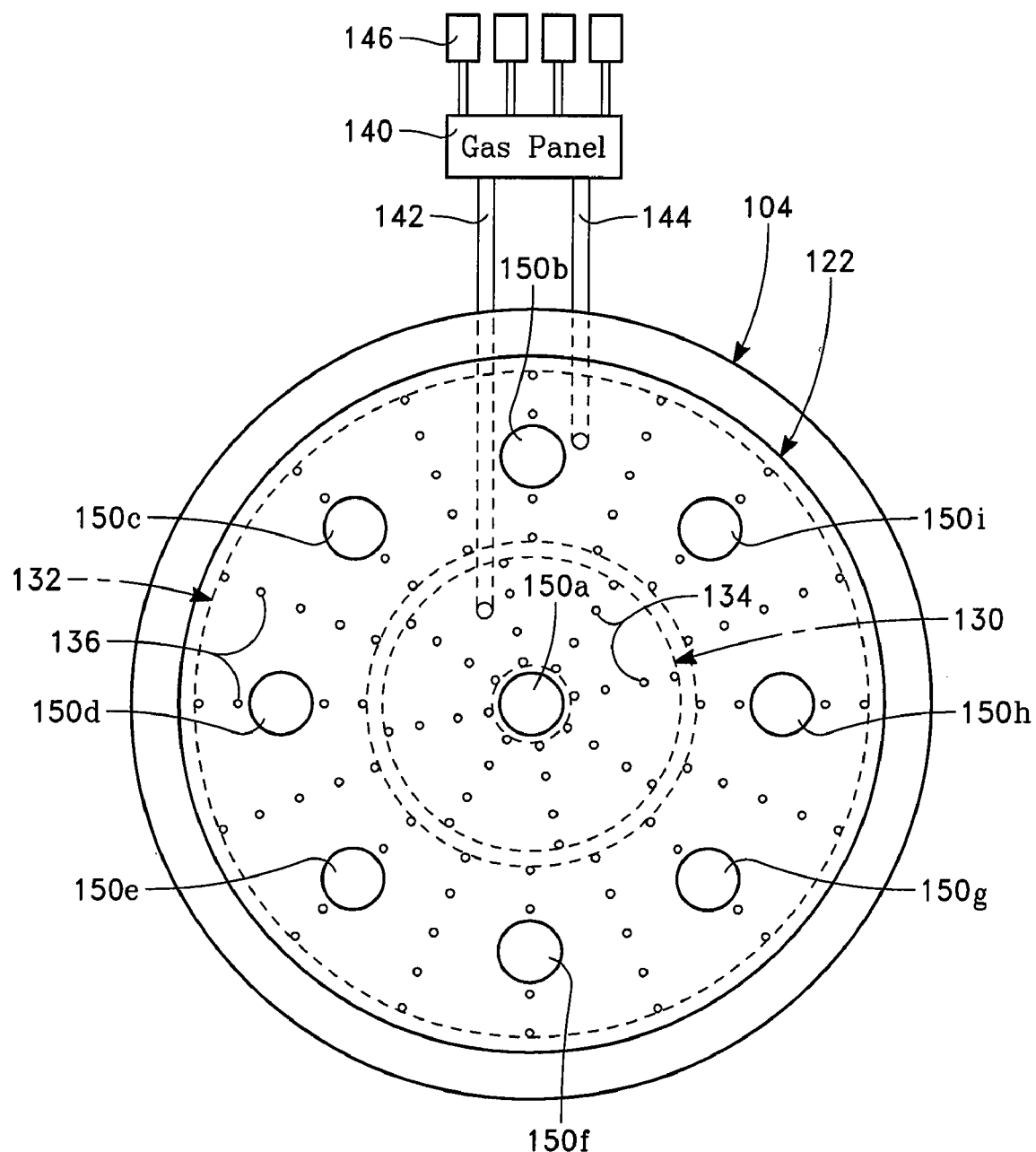
FIG. 6 is a bottom view of the ceiling of the reactor of FIG. 5.

FIGS. 5 and 6 depict a different embodiment, in which the gas distribution plate 122 has radially inner and outer internal gas manifolds 130, 132 that are separate from each other. In the embodiment of FIGS. 5 and 6, the bottom surface 122a of the gas distribution plate 122 has an inner zone of gas dispersing orifices 134 aligned with the inner gas manifold 130 and an outer zone of gas dispersing orifices 136 aligned with the outer gas manifold 132. Process gas is supplied independently to the gas manifolds 130, 132 by a gas panel 140 through respective gas supply conduits 142, 144. Various process gas supplies 146 may be coupled to the gas panel 140, the gas panel controlling flow rates from each of the individual gas supplies 146 to the different gas manifolds 130, 132. In the embodiment of FIGS. 5 and 6, the outer zone of gas dispersing orifices 136 extend radially beyond the outer circle of inductive power applicators 150b-150i.

Figure 7:
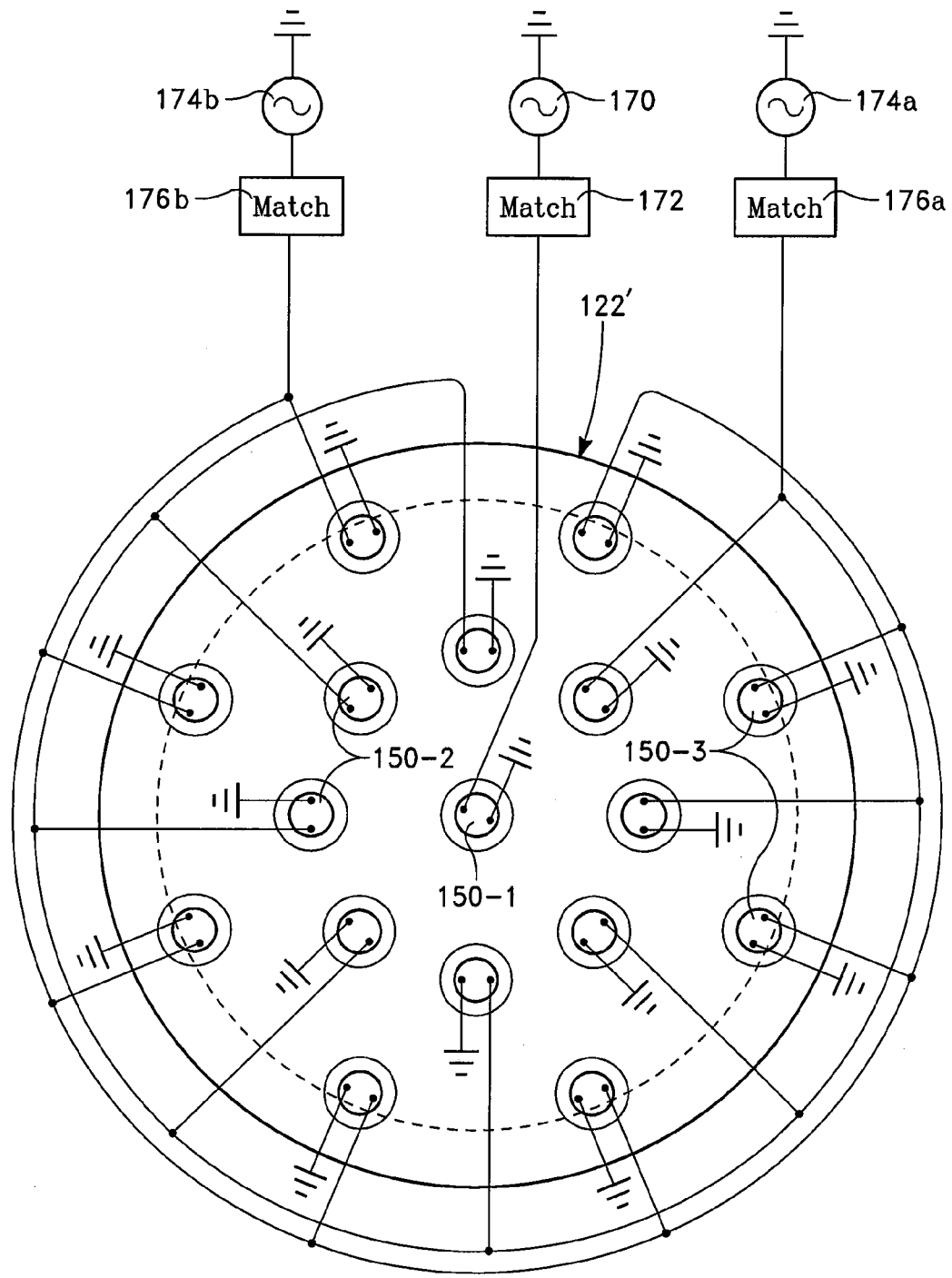
FIG. 7 is a top view of a reactor chamber in accordance with a third embodiment.

FIG. 7 is a top view of a gas distribution plate 122' in accordance with yet another embodiment in which the array of inductive power applicators 150 is arranged in three concentric groups of inductive power applicators. The center power applicator 150-1 is driven by a first RF generator 170 through and impedance match 172. An intermediate circle of power applicators 150-2 is driven by a second RF generator 174a through an impedance match 176a. The outermost circle of power applicators 150-3 is driven by a third RF generator 174b through an impedance match 176b.

Figure 8:
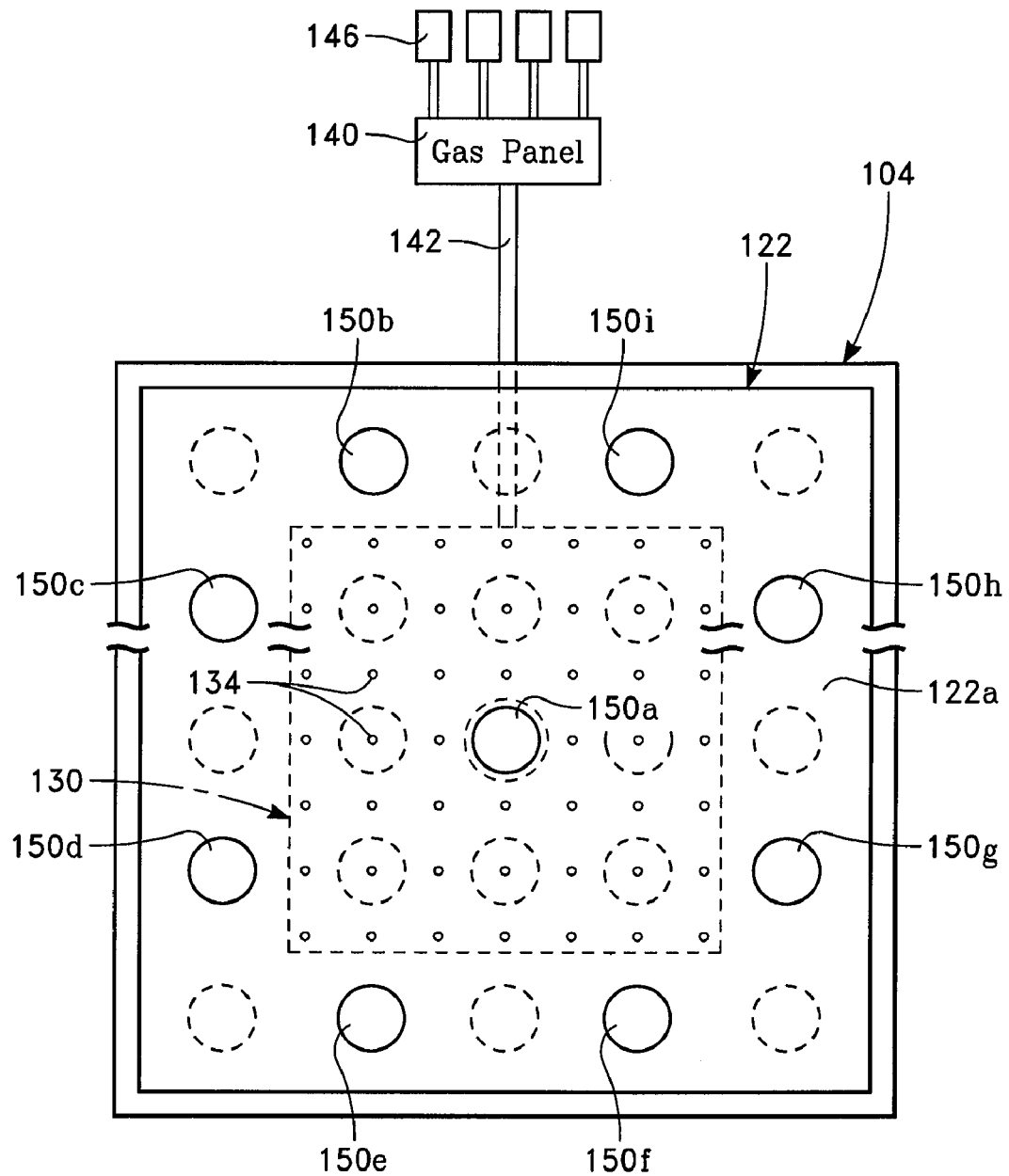
FIG. 8 depicts a modification of the embodiment of FIG. 2 having square symmetry for a square reactor chamber.

The foregoing embodiments have been described with reference to a cylindrical reactor chamber ceiling 104 and conductive gas distribution plate 122 with a circular arrangement of the inductively coupled power applicators 150. However, in other embodiments, the reactor chamber ceiling 104 and gas distribution plate 122 may be rectangular or square, with the individual inductively coupled power applicators 150 being arranged in a square or rectangular array. One example of such an embodiment is illustrated in FIG. 8, which is a modification of the embodiment of FIG. 2 in which the chamber ceiling 104 is square rather than cylindrical, the conductive gas distribution plate 122 is square and the plural power applicators 150b through 150i (solid line) integrated in the gas distribution plate 122 are arranged along the edge of an imaginary square (indicated in dashed line), the first power applicator 150a (solid line) being located at the center of the square gas distribution plate 104. Such an embodiment may have square or rectangular symmetry and may be particularly useful in fabrication of flat panel displays, solar arrays, and photolithographic masks, for example.

The foregoing embodiments have been described as having their inductive power applicators arranged in concentric symmetry. For example, the embodiment of FIG. 8 has been described as having the solid line power applicators 150 arranged in concentric symmetry, with an inner zone (e.g., the power applicator 150*a*) surrounded by an outer zone (e.g., the power applicators 150*b* through 150*i*). However, other arrangements may be made. For example, additional power applicators may be provided as indicated in dashed line in FIG. 8 so that all of the power applicators 150 are arranged in orthogonal rows and columns, providing uniform coverage of a square or rectangular workpiece.

The foregoing embodiments have been described with reference to RF power connections in which a circle of RF power applicators are connected to a single RF power generator in parallel. For example, in FIG. 7, an intermediate circle of power applicators 150 are coupled in parallel to the RF generator 174*a* while an outer circle of power applicators 150 are coupled in parallel to the RF generator 174*b*, and while a single power applicator 150 at the center is coupled individually to an individual RF generator 170. However, such connections may be modified so that the power applicators within a given circle are connected in series, or some in series and some in parallel, to a common RF generator. Furthermore, each of the power applicators may be coupled individual to an individual RF power generator. Alternatively, only some of the power applicators may be coupled individually to individual RF power generators while others are grouped with common RF power generators. For example, each or some of the RF power applicators 150 of FIG. 8 may be coupled individually to individual RF power generators.

While the foregoing is directed to embodiments of the present invention, other and further embodiments of the invention may be devised without departing from the basic scope thereof, and the scope thereof is determined by the claims that follow.

What is claimed is:

1. A plasma reactor comprising:
    a cylindrical side wall and a ceiling electrode enclosing a chamber, an insulator ring between said cylindrical side wall and said ceiling electrode, and a workpiece support pedestal inside said chamber and having a workpiece support surface facing said ceiling electrode and defining a processing zone between said support surface and said ceiling electrode;
    a first RF power generator coupled to said ceiling electrode;
    said ceiling electrode comprising a gas distribution plate, said gas distribution plate comprising:
        a metallic body having a bottom surface facing said workpiece support surface;
        plural gas disperser orifices in said bottom surface;
        an internal gas manifold within said gas distribution plate and coupled to said plural gas disperser orifices;
        an array of discrete RF power applicators in said gas distribution plate, said discrete RF power applicators being located in different zones, each one of said RF power applicators comprising:
            (a) an insulating cylindrical housing extending through said gas distribution plate, a portion of said housing extending through said internal gas manifold and through said bottom surface and into said processing zone;
            (b) a conductive solenoidal coil contained within said housing, a portion of the coil lying within the portion of the housing that extends through said bottom surface into said processing zone; and
        a plurality of second RF power generators, respective ones of said second RF power generators being coupled to respective ones of the conductive solenoidal coils of respective ones of respective ones of said different zones.

2. The apparatus of claim 1 wherein each solenoidal coil has a cylindrical diameter that is a fraction of a diameter of said gas distribution plate.

3. The apparatus of claim 2 wherein said fraction is in a range of 1/20 to 1/5.

4. The reactor of claim 1 wherein each said housing extends beyond said bottom surface into said processing zone by a fraction between one quarter and one half of a distance between said bottom surface and said workpiece support surface.

5. The apparatus of claim 1 wherein said housing has a cylindrical axis and said solenoidal coil has a cylindrical axis, said housing and said solenoidal coil being coaxial.

6. The apparatus of claim 1 wherein said coil has a cylindrical length and said housing has a cylindrical length generally corresponding to the length of the respective coil.

7. The apparatus of claim 1 wherein each RF power applicator further comprises a magnetically permeable core inside said solenoidal coil, said coil being wound around said core.

8. The apparatus of claim 7 wherein each said RF power applicator further comprises a thermally conductive rod coupled to said core, said apparatus further comprising a heat sink coupled to the thermally conductive rods of the array of RF power applicators.

9. The apparatus of claim 1 wherein said different zones comprise a radially inner zone and a radially outer zone, wherein one of said second RF power generators is coupled to the conductive solenoidal coils of said radially inner zone and another one of said second RF power generators is coupled to the conductive solenoidal coils of said radially outer zone.

* * * * *